United States Patent
Adem et al.

(10) Patent No.: US 6,869,878 B1
(45) Date of Patent: Mar. 22, 2005

(54) METHOD OF FORMING A SELECTIVE BARRIER LAYER USING A SACRIFICIAL LAYER

(75) Inventors: Ercan Adem, Sunnyvale, CA (US); John E. Sanchez, Palo Alto, CA (US); Darrell M. Erb, Los Altos, CA (US); Suzette K. Pangrle, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 8 days.

(21) Appl. No.: 10/367,406

(22) Filed: Feb. 14, 2003

(51) Int. Cl.$^7$ .................. H01L 21/4763; H01L 21/44
(52) U.S. Cl. .................. 438/687; 438/624; 438/627; 438/635; 438/637; 438/643; 438/675
(58) Field of Search .................. 438/637, 653, 438/656, 658, 622, 672, 675

(56) References Cited

U.S. PATENT DOCUMENTS

| | | | | |
|---|---|---|---|---|
| 6,171,960 B1 | * | 1/2001 | Lee ........................... | 438/687 |
| 6,259,160 B1 | * | 7/2001 | Lopatin et al. ............. | 257/762 |
| 6,294,463 B1 | * | 9/2001 | Tseng ........................ | 438/643 |
| 6,413,854 B1 | * | 7/2002 | Uzoh et al. ................. | 438/637 |
| 6,500,708 B2 | * | 12/2002 | Choi ......................... | 438/253 |
| 6,509,386 B1 | * | 1/2003 | Kohl .......................... | 521/77 |
| 2002/0093098 A1 | * | 7/2002 | Barr et al. .................. | 257/751 |
| 2002/0187631 A1 | * | 12/2002 | Kim et al. .................. | 438/637 |

* cited by examiner

*Primary Examiner*—Carl Whitehead, Jr.
*Assistant Examiner*—David L. Hogans
(74) *Attorney, Agent, or Firm*—Foley & Lardner LLP

(57) ABSTRACT

The reliability and performance of planarized metallization patterns in an electrical device, for example copper, inlaid in the surface of a layer of dielectric material overlying a semiconductor wafer substrate, are enhanced by a method for reliably depositing a barrier layer selective to the metallization patterns. The method comprises forming a sacrificial dielectric layer above a substrate. Metallization patterns are formed in the sacrificial dielectric layer. The barrier layer is selectively deposited on the metallization patterns. Portions of the barrier material undesirably deposited on the sacrificial dielectric layer are removed by removing the sacrificial dielectric layer, thus preventing bridging of adjacent metallization features by the barrier layer portions. An interlevel dielectric layer is then formed in place of the sacrificial dielectric layer. The selectively deposited barrier layer advantageously reduces parasitic capacitance between metallization features in comparison to a conventional blanket-deposited silicon nitride barrier layer.

25 Claims, 6 Drawing Sheets

METHOD OF FORMING A SELECTIVE BARRIER LAYER USING A SACRIFICIAL LAYER

BACKGROUND OF THE INVENTION

1. Field of the Invention

The present invention relates to electrical devices, e.g., semiconductor integrated circuit devices, having inlaid ("damascene"-type) metallization patterns, and to a method for reliably reducing parasitic capacitance between adjacent metal features. More specifically, the present invention relates to semiconductor devices comprising copper interconnection patterns and is applicable to manufacture of high speed integrated circuits having sub-micron dimensioned design features and high electrical conductivity interconnect structures.

2. Description of Related Art

There is an increasing demand for miniaturization in the integrated circuits industry. This demand has led to a steady reduction in separation between conductive lines in order to reduce integrated circuit size and/or increase density. The reduced spacing between the conductive lines has the undesirable effect of increasing the capacitance of whatever material lies between the conductive lines. This produces a phenomenon known as capacitive crosstalk.

In the past, overall integrated circuit (IC) performance depended primarily on device properties, however, this is no longer the case. Parasitic resistance, capacitance, and inductance associated with interconnections and contacts of an IC are beginning to become increasingly significant factors in IC performance. In current IC technology, the speed limiting factor is no longer device delay, but the resistive-capacitive (RC) delays associated with the conductive interconnections of the IC.

Conventional ICs typically employ an interconnect structure wherein a first conductive line is adjacent a second conductive line. If the capacitance between the first conductive line and the second conductive line is high, then the voltage on the first conductive line alters or affects the voltage on the second conductive line. This alteration in voltage may result in the IC being inoperable as a result of misinterpreting logic zeros, logic ones and voltage levels, and consequently incorrectly processing binary and/or analog information.

FIGS. 1a through 1d illustrate, in simplified, cross-sectional schematic form, a damascene process for forming an inlaid pattern of copper (Cu) metallization features according to conventional practices for manufacture of semiconductor integrated circuit devices. As shown in FIG. 1a, the desired arrangement of conductors is defined as a pattern of recesses 2 such as via holes, grooves, trenches, etc. formed by conventional photolithographic and etching techniques in the surface 4 of a dielectric layer 3 formed over the semiconductor substrate 1. Semiconductor substrate 1 typically comprises a wafer of monocrystalline Si or GaAs, dielectric layer 3 comprises an insulative material typically utilized as an interlevel dielectric (ILD), i.e., an inorganic material such as a silicon oxide, nitride, or oxynitride, or an organic-based or derived material, such as parylene or benzocyclobutene (BCB).

Then, as shown in FIG. 1b, a layer of conductive metal 5, for example, Cu or Cu-based alloy, is deposited by conventional plating techniques, e.g., electroless or electroplating techniques, to fill the recesses 2. In order to ensure complete filling of the recesses, the conductive metal 5 is deposited as a blanket (or "overburden") layer of excess thickness so as to overfill the recesses 2 and cover the upper surface 4 of the dielectric layer 3. Next, as shown in FIG. 1c, the entire excess thickness t of the overburden layer of conductive metal 5 over the surface of the dielectric layer 3 is removed by a CMP process utilizing, for example, an alumina (A 1203)-based slurry, leaving conductive portions 5' in the recesses 2 with their exposed upper surfaces 6 substantially co-planar with the surface 4 of the dielectric layer 3.

Referring to FIG. 1d, after removal of the excess thickness t of the overburden layer of conductive metal 5, a barrier layer 7 is deposited before any additional metallization levels are formed. The barrier layer 7 may be used to encapsulate the conductive metal 5 and is typically comprised of a dielectric such as silicon nitride.

The above-described conventional damascene-type process forms inlaid conductors (conductive portions 5') in the dielectric layer 3 while avoiding problems associated with other types of metallization patterning processing, for example blanket metal layer deposition, followed by photolithographic masking/etching and dielectric gap filling. A variant of the above-described technique, termed "dual damascene" processing, involves the formation of an opening comprising a lower contact or via hole section in communication with an upper groove or trench section, which opening is filled with a conductive material, typically a metal, to simultaneously form a conductive via plug in electrical contact with a conductive line. In addition, such single or dual damascene-type processing can be performed with a variety of other types of substrates, for example printed circuit boards, with and/or without intervening dielectric layers, and with a plurality of metallization levels, i.e., five or more levels.

In order to reduce capacitive coupling and therefore reduce capacitive crosstalk, low dielectric constant ("low-K") materials have been developed to replace conventional dielectric/insulation materials that lie between conductive lines in order to insulate one conductive line from the other. This low-k dielectric material may be used in order to reduce the parasitic capacitance between adjacent conductors.

However, a problem associated with the above-described process is that when a barrier layer composed of a material, for example silicon nitride, which has a relatively high dielectric constant, is blanket-deposited over adjacent conductors as shown in FIG. 1d, it tends to increase the parasitic capacitance between the adjacent conductors. The increased parasitic capacitance due to the deposition over adjacent conductors of a barrier layer comprising silicon nitride thus increases the overall RC time constant of the metallization patterns of the electrical device.

The parasitic capacitance may be reduced by depositing a barrier layer only on the metallization patterns and not on the dielectric material between the metallization patterns. Methods exist for selectively depositing a barrier layer material over metallization features, such as conductive lines. One such method is described in commonly assigned U.S. Pat. No. 6,259,160, incorporated by reference herein for its teachings regarding the formation of a semiconductor device having a selectively fabricated Cu interconnect structure that is encapsulated within selectively formed metallic barriers. A selective metallic capping step comprises depositing a selective electroless metal barrier, preferably comprising Co-W-P (cobalt-tungsten-phosphide), over a Cu interconnect structure.

However, in practice, these methods may not be entirely selective and may undesirably deposit portions of the metal barrier on top of the dielectric between conductive lines. These barrier layer portions are undesirable because they may lead to bridging between conductive lines. This bridging of conductive lines, in turn, may lead to compromised performance or even destruction of the electrical device.

Thus, there exists a need for a metallization process methodology which results in lower inter-line capacitance, and thus produces lower RC time constant metallization patterns, by depositing a metallic barrier by a selective deposition process that is preferential to the metallization patterns, while at the same time substantially eliminating bridging of conductive lines by inter-line metallic barrier portions which may be undesirably produced as a by-product of a selective barrier layer deposition process.

Furthermore, there exists a need for a metallization process methodology which enables formation of damascene structures, for example interconnect and routing lines (particularly of Cu or Cu-based alloys) having high reliability, high product yield, and lower RC time constant metallization patterns.

Moreover, there exists a need for improved metallization processing technology which is fully compatible with conventional process flow, methodology, and throughput requirements in the manufacture of integrated circuit semiconductor devices and other devices requiring inlaid metallization patterns.

SUMMARY OF THE DISCLOSURE

Embodiments of the invention address the foregoing shortcomings of the conventional technology by providing methods for forming metallization patterns in a sacrificial layer and then forming on the metallization patterns and sacrificial layer a metal barrier formed thereon by a selective deposition process which preferentially deposits the metal barrier over the metallization patterns. The sacrificial layer is then removed along with metal barrier portions undesirably formed on the sacrificial layer during the selective barrier layer deposition process. Thus, a lower inter-line capacitance is achieved while at the same time reducing bridging of conductive lines by the metal barrier portions which may be undesirably produced as a by-product of a selective barrier layer deposition process.

In accordance with preferred embodiments, a substrate is provided and a dielectric stack is formed above the substrate, the dielectric stack comprising a sacrificial dielectric layer. The dielectric stack may then be patterned to form a plurality of recesses therein for providing, for example, vias, inter-level metallization, and/or interconnection lines on the electrical or electronic device.

A conductive layer may then be deposited over an upper, exposed surface of the dielectric stack so as to fill the plurality of recesses. The conductive layer may then be planarized such that an upper, exposed surface of the conductive layer is substantially co-planar with the upper, exposed surface of the dielectric stack.

A barrier layer may then be selectively deposited on the upper, exposed surface of the planarized conductive layer (the metallization pattern). The sacrificial dielectric layer may then be removed after the selective deposition of the barrier layer, thus also advantageously removing barrier layer portions undesirably deposited on the surface of an inter-line dielectric during the selective deposition of the barrier layer. A replacement dielectric may then be formed in place of the sacrificial dielectric layer to encapsulate the conductive layer and the barrier layer.

Thus, a selective barrier layer may be reliably formed on a metallization pattern to produce a lower parasitic capacitance between adjacent metallization features (for example, conductive lines) when compared to a conventional barrier layer comprising, for example, a blanket layer of silicon nitride deposited over adjacent conductors. Thus, employing embodiments of the present invention, an electrical device with lower overall RC time constant metallization patterns may be reliably produced.

These and other objects, features, and advantages of embodiments of the invention will be apparent to those skilled in the art from the following detailed description of embodiments of the invention, when read with the drawings and appended claims.

BRIEF DESCRIPTION OF THE DRAWINGS

Referring now to the drawings in which like reference numbers represent corresponding parts throughout.

DETAILED DESCRIPTION OF PREFERRED EMBODIMENTS

Structure formed during processing in accordance with a preferred embodiment of the invention are shows in FIGS. 2a through 2i, which show, in simplified, cross-sectional, schematic fashion, an illustrative, but not limiting, embodiment of the present invention.

Figure 1A:
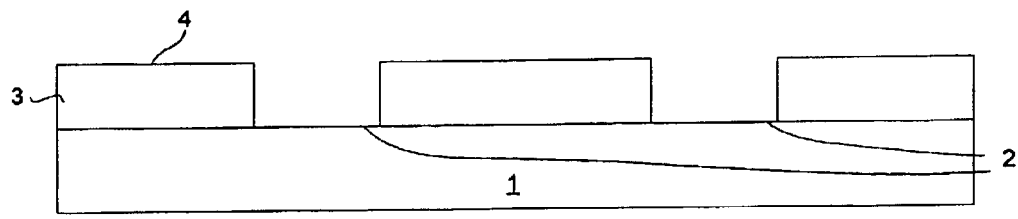
FIGS. 1a, 1b, 1c, and 1d illustrate, in cross-sectional schematic form, a process for forming a pattern of damascene-type, inlaid Cu metallization features according to conventional practices for manufacture of semiconductor integrated circuit devices.
Figure 1B:
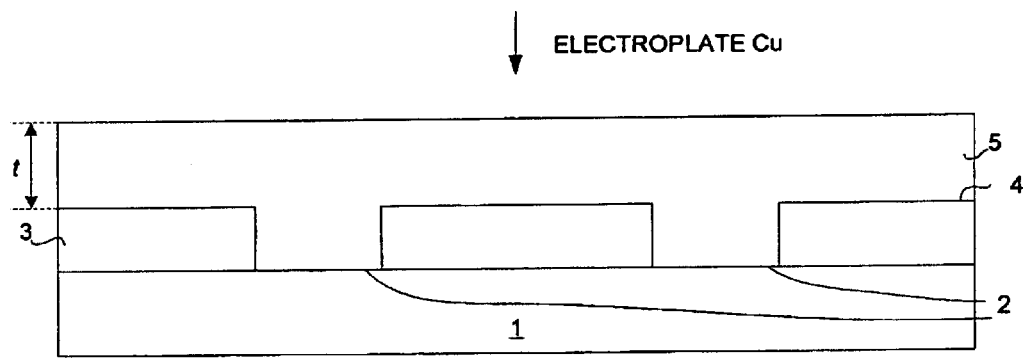
Figure 1C:
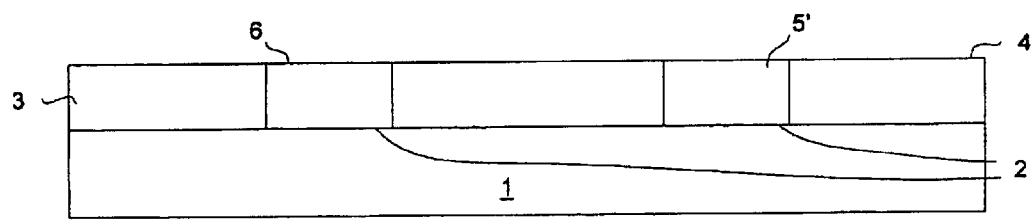
Figure 1D:
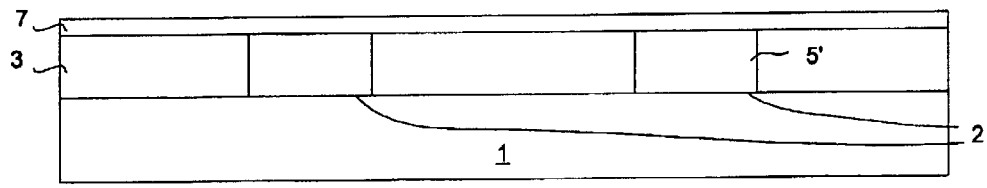
Figure 2A:
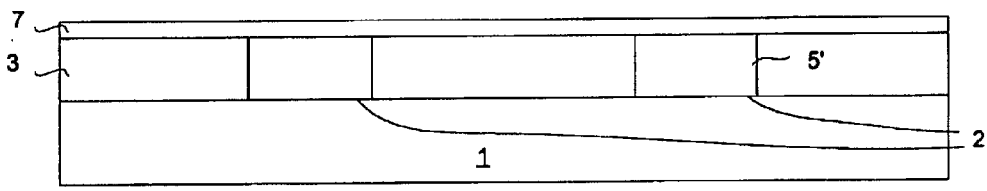
FIGS. 2a, 2b, 2c, 2d, 2e, 2f, 2g, 2h, 2i and illustrate, in cross-sectional schematic form, a process for reliably producing low RC time constant metallization patterns, according to embodiments of the present invention.

FIG. 2a shows a semiconductor substrate-based workpiece similar to that shown in FIG. 1d, including inlaid conductors 5' overlain by a barrier layer 7. The semiconductor substrate 1 may comprise a semiconductor material such as monocrystalline silicon (Si) or gallium arsenide (GaAs).

Figure 2B:
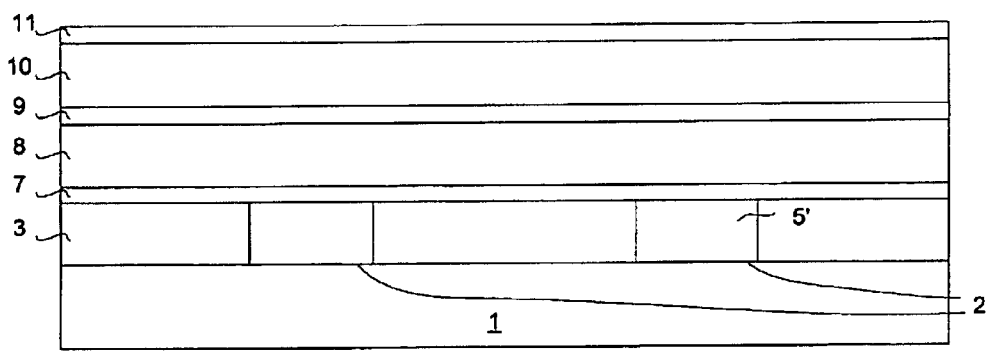

As shown in FIG. 2b, according to embodiments of the present invention, a dielectric stack may be formed above the substrate, for example over the previous metallization layer shown in FIG. 2a. The dielectric stack may comprise sequential layers of different materials. As an example, the dielectric stack shown in FIG. 2b begins with an interlevel dielectric layer 8 formed over barrier layer 7. An etch stop layer 9 is formed over the interlevel dielectric layer 8. A sacrificial dielectric layer 10 may then be formed over etch stop layer 9. A capping layer 11 is formed over the sacrificial dielectric layer 10 to complete the dielectric stack.

Interlevel dielectric layer 8 is preferably a material a lower dielectric constant (low-K) than dielectric constants of silicon dioxide and silicon nitride. Such materials include poly(arylene ether) ("PAE"), fluorinated polymide ("FPI"), benzocyclobutene ("BCB"), hydrogen silsesquioxane ("HSQ"), methyl silsesquioxane ("MSQ"), and xerogel. Etch stop layer 9 may comprise a suitable etch stop layer material, such as silicon nitride or silicon carbide. The sacrificial dielectric layer 10 is preferably comprised of a material that can be easily removed without damaging other non-sacrificial structure, for example, by thermal processing utilizing temperatures in the range of 50–400 degrees C., by etching in $NH_3$, or by ashing in an oxygen atmosphere. A number of organic polymers may be employed as the sacrificial dielectric layer to facilitate removal in one of these manners. Examples include polycarbonates and polynorbornes.

Figure 2C:
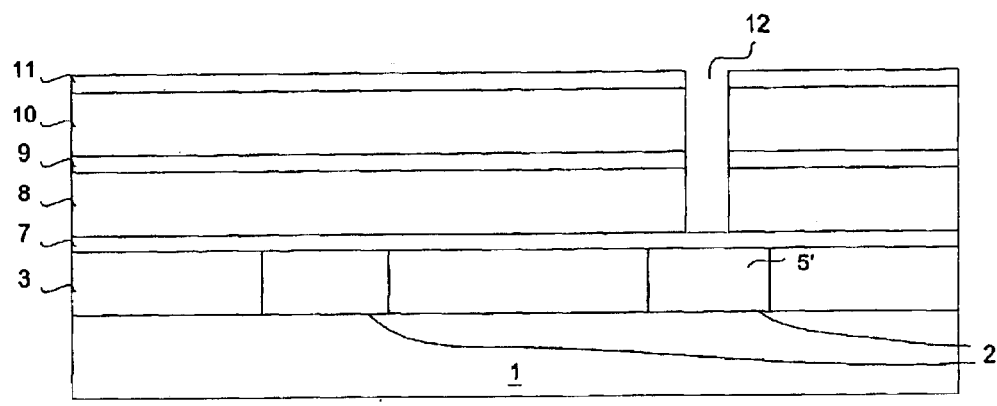

As shown in FIG. 2c, recesses are then formed in the dielectric stack for forming, for example, vias, interlevel metallization, and/or interconnection routing. As an example, via 12 is formed in the dielectric stack by conventional masking and etching techniques, stopping on barrier layer 7.

Figure 2D:
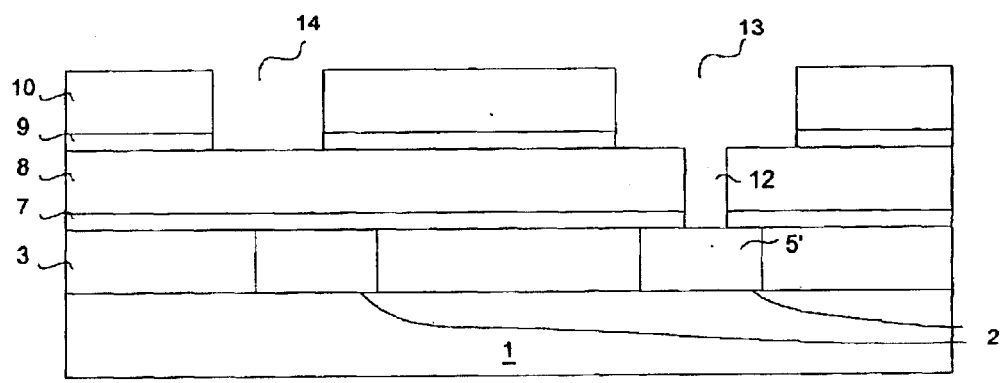

As shown in FIG. 2d, trench 13 and trench 14 are then formed in sacrificial dielectric layer 10 and etch stop layer 9 by conventional masking and etching techniques, removing the capping layer 11 and stopping on interlevel dielectric layer 8.

Figure 2E:
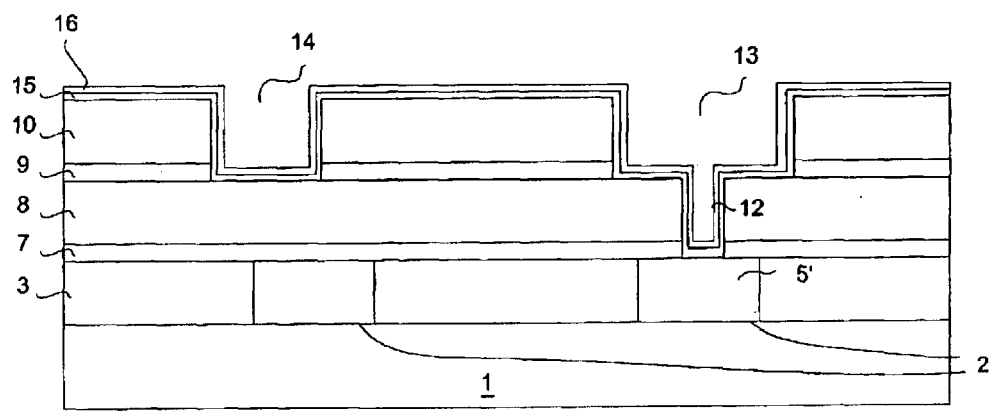

Referring now to FIG. 2e, in some embodiments, barrier liner 15 may be deposited over the dielectric stack to cover bottom and sidewall surfaces of the dual damascene trench structure 12, 13 and trench 14. The barrier liner material 15 is chosen to substantially prevent diffusion of subsequently electroplated metal (for example Cu) from via 12, trench 13, and trench 14 into surrounding dielectric materials. Suitable materials for barrier liner 15 include, for example, Ti, W, Cr, Ta, and tantalum nitride (TaN). A Cu seed layer 16 is then deposited over barrier liner 15. The Cu seed layer 16 provides a base for the subsequently plated Cu that will fill the dual damascene trench structure 12, 13 and trench 14.

Figure 2F:
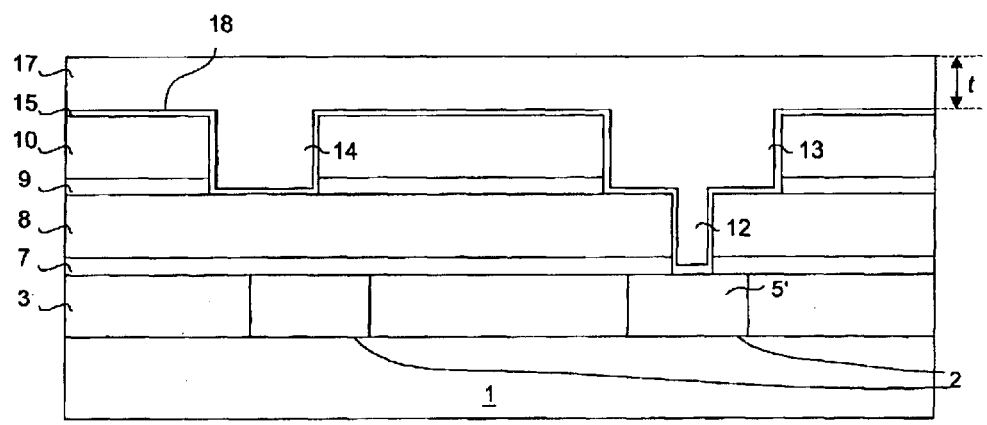

Referring now to FIG. 2f, conductive layer 17, which is preferably. Cu or Cu-based alloy, is deposited by electroless plating or electroplating on the an upper exposed surface of the dielectric stack to fill the dual damascene trench structure 12, 13 and trench 14. In order to ensure complete filling of the dual damascene trench structure 12, 13 and trench 14, the conductive layer 17 is deposited as a blanket (or "overburden") layer of excess thickness t so as to overfill trench 13, and trench 14 and cover the upper surface 18 of barrier liner 15.

Figure 2G:
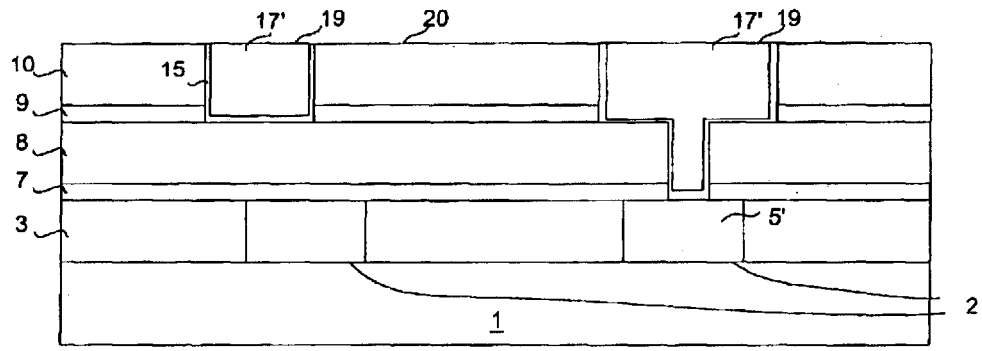

Next, as shown in FIG. 2g, the entire excess thickness (t in FIG. 2f) of the overburden portion of conductive layer 17 over the upper surface 18 of barrier liner 15 is removed by a planarization process, for example a CMP process utilizing an alumina (A 1203)-based slurry. The portion of barrier liner 15 above the upper surface 20 of sacrificial dielectric layer 10 is also removed, leaving conductive elements 17' with their upper, exposed surfaces 19 substantially co-planar with the upper, exposed surface 20 of sacrificial dielectric layer 10.

Figure 2H:
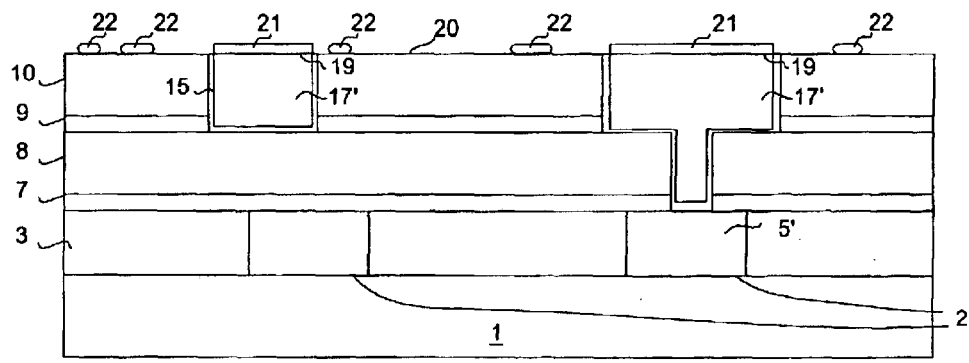

Referring now to FIG. 2h, in a preferred embodiment, barrier layer 21 is selectively deposited over conductive elements 17'. Barrier layer 21 may be selectively plated over conductive elements 17' and may comprise Co-W-P (cobalt-tungsten-phosphide). Perfect selectivity in the barrier layer deposition process is typically not attainable. As a result, residual barrier material portions 22 may be deposited on the upper surface of sacrificial dielectric layer 10 as an undesirable by-product of the selective deposition step. As discussed above, the residual barrier material portions 22 may undesirably bridge adjacent conductive lines, possibly resulting in compromised performance or even destruction of the electrical device. Therefore, to ensure reliable operation of the electrical device, these barrier layer portions 22 should be removed.

Figure 2I:
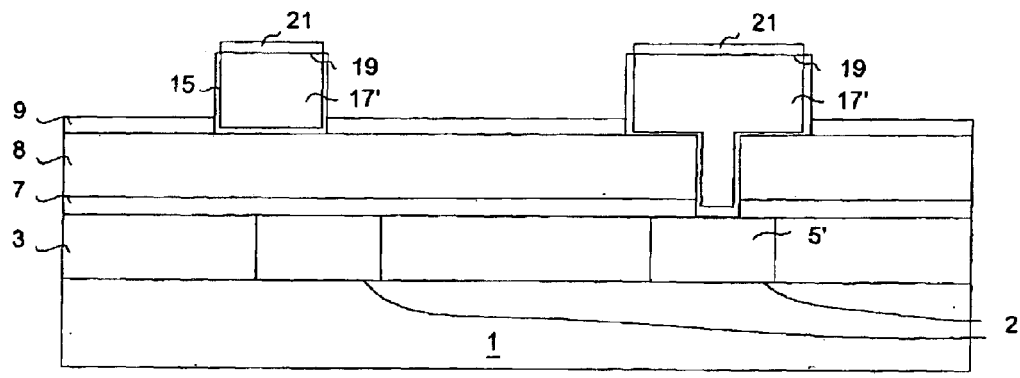

FIG. 2i shows the structure of FIG. 2h after removal of the sacrificial dielectric layer 10 along with the residual barrier material portions 22. The sacrificial material 10 is preferably removed by a thermal decomposition, however other suitable processes such as etching may be employed in accordance with the particular sacrificial material. In the process of removing the sacrificial dielectric layer 10, residual barrier material portions 22 are also removed.

Figure 2J:
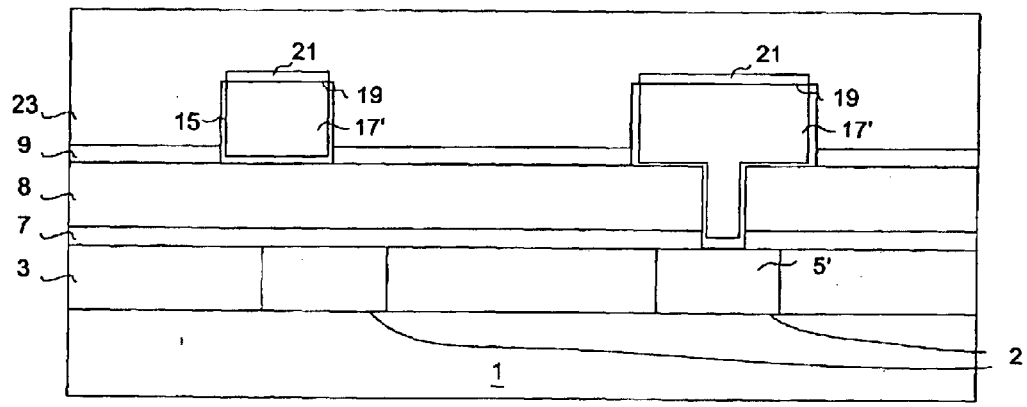

Referring now to FIG. 2j, an interlevel dielectric layer 23 is then deposited over barrier layer 21 and conductive elements 17'. Replacement dielectric layer 23 preferably has a lower dielectric constant (low-K) than a dielectric constant than silicon dioxide and silicon nitride. Such materials include poly(arylene ether) ("PAE"), fluorinated polymide ("FPI"), benzocyclobutene ("BCB"), hydrogen silsesquioxane ("HSQ"), methyl silsesquioxane ("MSQ"), and xerogel.

The above-described processing may be repeated for additional metallization layers.

While the processing of FIGS. 2a–2i is presently preferred, alternative processing may be implemented. For example, in accordance with one alternative, the conductive layer 17 of FIG. 2f may contain carbon, nitrogen, or oxygen. In this embodiment, barrier layer 21 may comprise a thin metal layer (for example with a thickness of between 10 and 100 Angstroms) selectively deposited over conductive elements 17'. The carbon, nitrogen, or oxygen contained in conductive layer 17 may then, in preferred embodiments, be diffused into the barrier layer 21 to form a metal carbide, metal nitride, or metal oxide. In these preferred embodiments, suitable metals for barrier layer 21 include, but are not limited to, zirconium (Zr), thorium (Th), molybdenum (Mo), and tantalum (Ta).

Figure 3:
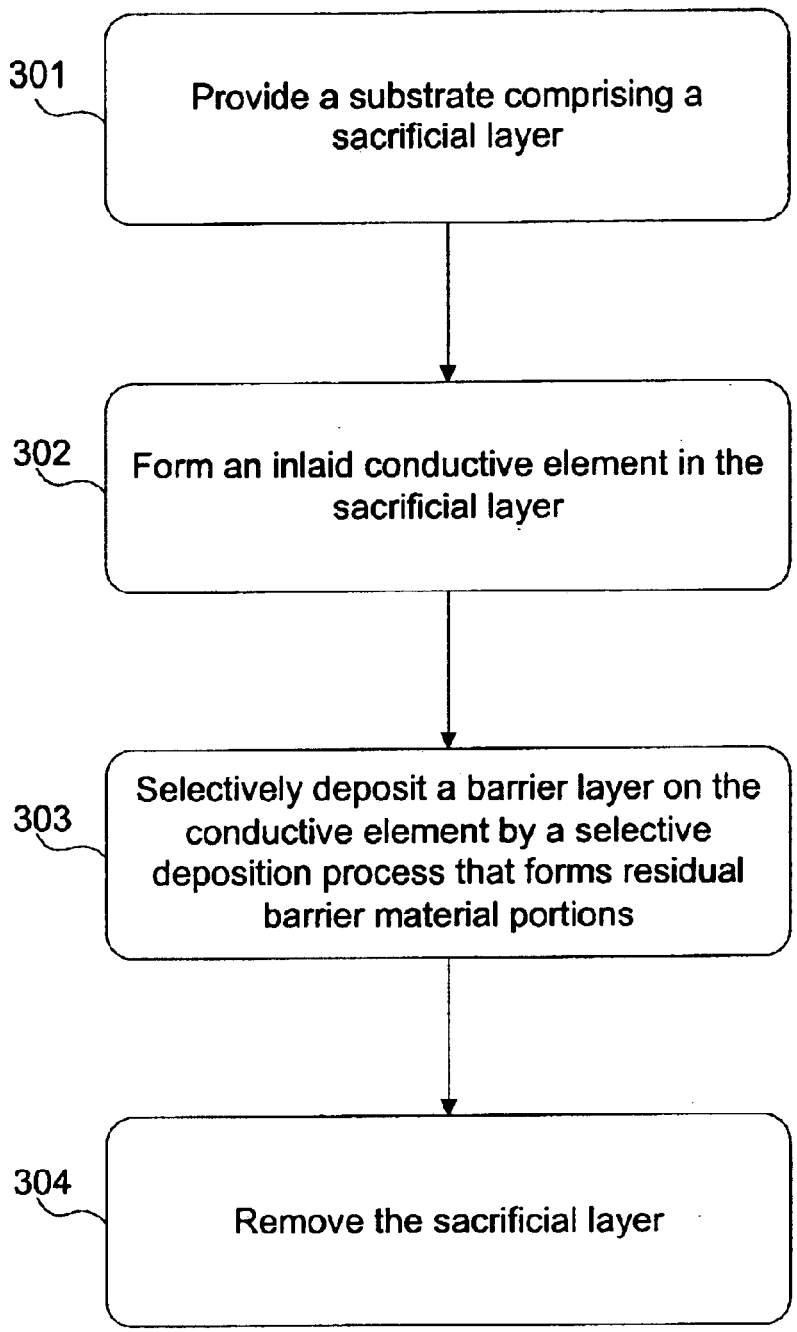
FIG. 3 shows a process flow diagram illustrating an embodiment of the present invention.

FIG. 3 shows a process flow encompassing the preferred embodiment, the aforementioned alternatives, and further alternative embodiments. Initially, a substrate comprising a layer of a sacrificial material is provided (301). A conductive element is then inlaid in the sacrificial layer (302). A barrier material is then selectively deposited on an exposed surface of the conductive element by a selective deposition process that preferentially deposits the barrier layer material on the conductive element and also forms residual barrier material portions on the sacrificial layer (303). The sacrificial layer is then removed after depositing the barrier layer (304). By removing the sacrificial layer, any residual barrier material portions that were deposited on the sacrificial material are also removed.

Embodiments of the present invention thus provide a method for reducing parasitic capacitance between adjacent conductors which may be the result of blanket-depositing over adjacent conductors a barrier layer composed of a material, for example silicon nitride, which has a relatively high dielectric constant.

Embodiments of the present invention also provide a method for reducing, or substantially preventing, bridging between conductive lines. Such bridging may be the result of undesirably depositing barrier layer portions on the dielectric between conductive lines during a selective deposition process.

Moreover, embodiments of the present invention are fully compatible with conventional process flow for automated manufacture of high-density integration semiconductor devices, as well as other types of electrical and electronic devices and/or components.

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method of making an electrical device, comprising:
   providing a substrate comprising a sacrificial layer;
   forming an inlaid conductive element in the sacrificial layer, wherein the conductive element comprises copper containing one of nitrogen and oxygen;
   depositing a barrier layer metal on an exposed surface of the conductive element by a selective deposition process that forms residual barrier material portions on the sacrificial layer;
   removing the sacrificial layer, thereby removing residual barrier material portions deposited on the sacrificial layer; and
   converting the barrier layer metal to one of a metal nitride and a metal oxide by diffusing one of nitrogen and oxygen from the conductive element into the barrier layer metal.

2. The method recited in claim 1, wherein the sacrificial layer comprises a dielectric material.

3. The method recited in claim 2, wherein the dielectric material comprises an organic polymer.

4. The method recited in claim 3, wherein the dielectric material is a polycarbonate.

5. The method recited in claim 3, wherein the dielectric material is a polynorborne.

6. The method recited in claim 1, wherein the sacrificial layer is removed by thermal decomposition.

7. The method recited in claim 6, wherein the thermal decomposition utilizes temperatures in the range of about 50 degrees Celsius to about 400 degrees Celsius.

8. The method recited in claim 1, wherein the sacrificial layer is removed by etching in $NH_3$.

9. The method claimed in claim 1, wherein the sacrificial layer is removed by ashing in an oxygen atmosphere.

10. The method recited in claim 1, further comprising forming an interlevel dielectric layer over the conductive element and the barrier layer.

11. The method recited in claim 10, wherein the interlevel dielectric layer comprises at least one of poly(arylene ether) ("PAE"), fluorinated polymide ("FPI"), benzocyclobutene ("BCB"), hydrogen silsesquioxane ("HSQ"), methyl silsesquioxane ("MSQ"), and xerogel.

12. The method recited in claim 1, wherein forming the conductive element comprises:
    forming on the substrate a dielectric stack;
    forming a recess in the dielectric stack;
    depositing a conductive layer on an exposed surface of the dielectric stack to fill the recess; and
    planarizing the conductive layer such that an exposed surface of the conductive layer is substantially co-planar with the exposed surface of the dielectric stack.

13. The method recited in claim 12, wherein the dielectric stack comprises sequential layers of an interlevel dielectric layer, an etch stop layer, a sacrificial dielectric layer, and a capping layer.

14. The method recited in claim 13, wherein the interlevel dielectric layer comprises at least one of poly(arylene ether) ("PAE"), fluorinated polymide ("FPI"), benzocyclobutene ("BCB"), hydrogen silsesquioxane ("HSQ"), methyl silsesquioxane ("MSQ"), and xerogel.

15. The method recited in claim 13, wherein the etch stop layer comprises silicon nitride.

16. The method recited in claim 12, wherein the recess is a dual damascene trench structure.

17. The method recited in claim 12, wherein the conductive layer is deposited by one of an electroplating and electroless plating process.

18. The method recited in claim 17, further comprising forming a seed layer on surfaces of the recess before depositing the conductive layer.

19. The method recited in claim 18, further comprising forming a barrier liner on surfaces of the recess before forming the seed layer.

20. The method recited in claim 12, wherein the conductive layer is planarized by a chemical-mechanical polishing (CMP) process.

21. The method recited in claim 12, wherein the electrical device comprises a semiconductor integrated circuit device,
    wherein the substrate comprises a semiconductor material comprising one of monocrystalline silicon (Si) and gallium arsenide (GaAs), and
    wherein the dielectric stack is formed on at least a portion of the substrate, and
    wherein the conductive element comprises one of a via, an interlevel metallization, and an interconnection lines of the electrical device.

22. The method recited in claim 1, wherein the barrier layer is deposited by electroless plating.

23. The method recited in claim 1, wherein the barrier layer comprises Co-W-P (cobolt-tungsten-phosphide).

24. The method recited in claim 1, wherein the barrier layer metal comprises at least one of zirconium (Zr), thorium (Th), molybdenum (Mo), and tantalum (Ta).

25. The method recited in claim 1, wherein the barrier layer has out 10 and 100 Angstroms.

* * * * *